(12) United States Patent
Ogushi et al.

(10) Patent No.: US 10,763,183 B2
(45) Date of Patent: Sep. 1, 2020

(54) SEMICONDUCTOR DEVICE

(71) Applicant: Mitsubishi Electric Corporation, Tokyo (JP)

(72) Inventors: Naohiro Ogushi, Tokyo (JP); Koichi Taguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/318,537

(22) PCT Filed: Nov. 25, 2016

(86) PCT No.: PCT/JP2016/085007
§ 371 (c)(1),
(2) Date: Jan. 17, 2019

(87) PCT Pub. No.: WO2018/096656
PCT Pub. Date: May 31, 2018

(65) Prior Publication Data
US 2019/0318971 A1  Oct. 17, 2019

(51) Int. Cl.
*H01L 23/055* (2006.01)
*H01L 23/00* (2006.01)

(52) U.S. Cl.
CPC ............ *H01L 23/055* (2013.01); *H01L 24/48* (2013.01); *H01L 24/73* (2013.01);
(Continued)

(58) Field of Classification Search
CPC ........... H01L 23/48; H01L 2224/48091; H01L 23/055; H01L 25/07; H01L 24/73;
(Continued)

(56) References Cited

U.S. PATENT DOCUMENTS 5,920,119 A * 7/1999 Tamba ................ H01L 25/072
257/718
7,868,436 B2 * 1/2011 Shiota .................. H01L 23/24
257/678
(Continued)

FOREIGN PATENT DOCUMENTS

JP  S61-001042 A  1/1986
JP  H11-097611 A  4/1999
(Continued)

OTHER PUBLICATIONS

International Search Report; Written Opinion; and Notification of Transmittal of the International Search Report and the Written Opinion of the International Searching Authority, or the Declaration issued in PCT/JP2016/085007; dated Feb. 7, 2017.
(Continued)

*Primary Examiner* — Jasmine J Clark
(74) *Attorney, Agent, or Firm* — Studebaker & Brackett PC

(57) ABSTRACT

A case (6) surrounds a semiconductor chip (5). A case electrode (7) is attached to an upper face of the case (6). A wire (8) is connected to the semiconductor chip (5) and the case electrode (7). A first holding portion (10) presses down the case electrode (7) on the upper face of the case (6) outside a joint portion where the wire (8) is bonded to the case electrode (7). A second holding portion (11) presses down the case electrode (7) on the upper face of the case (6) inside the joint portion. A recess (12) is formed on the upper face of the case (6). The case electrode (7) is bent such as to fit into the recess (12). The second holding portion (11) is disposed inside the recess (12).

16 Claims, 8 Drawing Sheets

(52) U.S. Cl.
CPC ........... *H01L 2224/48091* (2013.01); *H01L 2224/48155* (2013.01); *H01L 2224/73265* (2013.01)

(58) Field of Classification Search
CPC ........... H01L 24/48; H01L 2224/73265; H01L 2924/181; H01L 25/18; H01L 23/481
See application file for complete search history.

(56) References Cited

U.S. PATENT DOCUMENTS

| | | |
|---|---|---|
| 2012/0241932 A1 | 9/2012 | Goto |
| 2015/0371931 A1 | 12/2015 | Nishida et al. |
| 2016/0155687 A1 | 6/2016 | Takizawa |

FOREIGN PATENT DOCUMENTS

| | | |
|---|---|---|
| JP | H11-330344 A | 11/1999 |
| JP | 2009-021286 A | 1/2009 |
| JP | 2009-130007 A | 6/2009 |
| JP | 2011-014739 A | 1/2011 |
| JP | 2012-204667 A | 10/2012 |
| JP | 2013-145825 A | 7/2013 |
| JP | 2016-111028 A | 6/2016 |
| WO | 2014/199764 A1 | 12/2014 |

OTHER PUBLICATIONS

An Office Action mailed by the Japanese Patent Office dated Jan. 7, 2020, which corresponds to Japanese Patent Application No. 2018-552356 and is related to U.S. Appl. No. 16/318,537.

* cited by examiner

SEMICONDUCTOR DEVICE

FIELD

The present invention relates to a semiconductor device in which a wire is bonded to a case electrode, and more particularly to a semiconductor device that enables reduction of wire height.

BACKGROUND

In semiconductor devices for power conversion, wires are bonded to case electrodes by ultrasonic bonding or the like. For better wire bonding properties, the case electrodes need to be firmly secured to the case. As prior art, there is a design wherein case electrodes are formed by insertion molding (see, for example, PTL 1: Embodiment 3, FIG. 25 to FIG. 28, or PTL 2: Embodiment 1, FIG. 5).

CITATION LIST

Patent Literature

[PTL 1] Japanese Patent Application Laid-open No. 2009-21286
[PTL 2] Japanese Patent Application Laid-open No. 2009-130007

SUMMARY

Technical Problem

Insertion molding of case electrodes does not secure the case electrodes firmly enough. The case electrodes are therefore held on both inner and outer sides of wire joint portions. This, however, led to the necessity to increase the wire height so that the wire does not touch a holding portion that presses down the case electrode inside the joint portion. When the wire is positioned highest among the structural components inside the case, sealing material needs to be poured up to a height matching the wire height. This led to the problem of increased thickness, weight, and cost of the semiconductor device.

The present invention was made to solve the problem described above and it is an object of the invention to provide a semiconductor device that enables a reduction in wire height while allowing wire bonding properties to be improved.

Solution to Problem

A semiconductor device according to the present invention includes: a semiconductor chip; a case surrounding the semiconductor chip; a case electrode attached to an upper face of the case; a wire connected to the semiconductor chip and the case electrode; a first holding portion pressing down the case electrode on the upper face of the case outside a joint portion where the wire is bonded to the case electrode; and a second holding portion pressing down the case electrode on the upper face of the case inside the joint portion, wherein a recess is formed on the upper face of the case, the case electrode is bent such as to fit into the recess, and the second holding portion is disposed inside the recess.

Advantageous Effects of Invention

In the present invention, the first holding portion and second holding portion press down both ends of the case electrode and firmly secure the case electrode to the case. Thus, the wire bonding properties can be improved. Further, the second holding portion is disposed inside the recess on the upper face of the case so that the height of the upper face of the second holding portion is not greater than that of the upper face of the case electrode outside the recess. Therefore, the height of the wire can be reduced.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
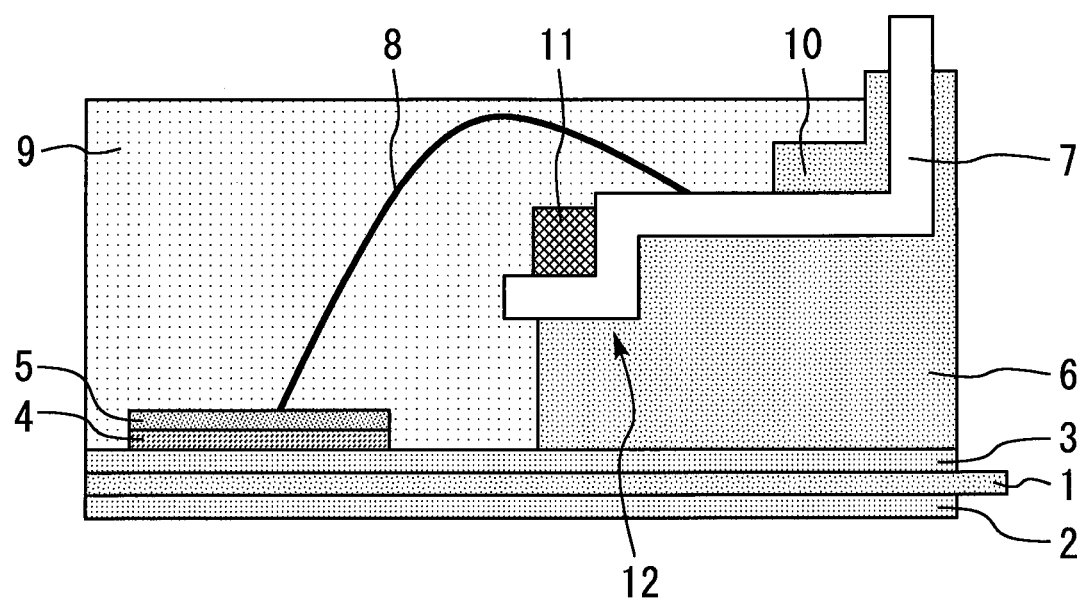
FIG. 1 is a cross-sectional view illustrating a semiconductor device according to Embodiment 1 of the present invention.
Figure 2:
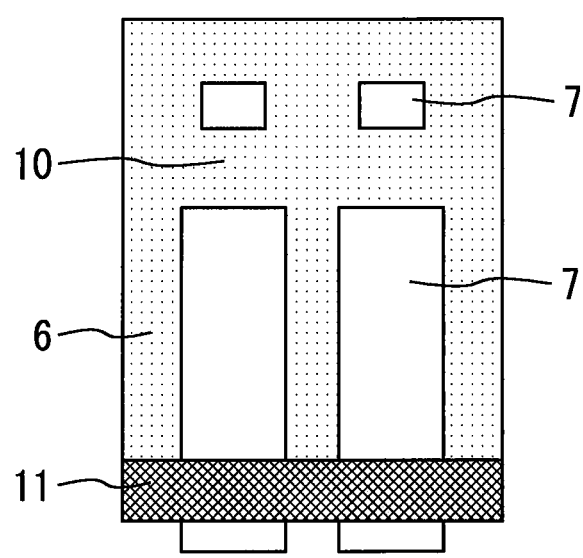
FIG. 2 is a top view illustrating a case electrode according to Embodiment 1 of the present invention.

FIG. 1 is a cross-sectional view illustrating a semiconductor device according to Embodiment 1 of the present invention. FIG. 2 is a top view illustrating a case electrode according to Embodiment 1 of the present invention. A lower surface electrode 2 is provided on the lower surface of an insulating substrate 1, and a base plate 3 is provided on the upper face of the substrate. A semiconductor chip 5 is provided on the base plate 3 via solder 4.

A case 6 surrounds the semiconductor chip 5 on the base plate 3. A case electrode 7 is attached to an upper face of the case 6. A wire 8 is connected to the semiconductor chip 5 and the case electrode 7. The semiconductor chip 5 and wire 8 are sealed with a sealing material 9 inside the case 6.

A first holding portion 10 presses down the case electrode 7 on the upper face of the case 6 outside a joint portion where the wire 8 is bonded to the case electrode 7. A second holding portion 11 presses down the case electrode 7 on the upper face of the case 6 inside the joint portion. The first holding portion 10 and the second holding portion 11 are made of the same material as the case 6, i.e., case resin.

A recess 12 is formed in an inner corner on the upper face of the case 6. The case electrode 7 is bent such as to fit into the recess 12. The second holding portion 11 is disposed inside the recess 12. The upper face of the second holding portion 11 is positioned at a height not greater than that of the upper face of the joint portion of the case electrode 7.

As the first holding portion 10 and second holding portion 11 press down both ends of the case electrode 7 and firmly secure the case electrode 7 to the case 6, the wire bonding properties can be improved. Since the second holding portion 11 is disposed inside the recess 12 on the upper face of the case 6 to keep the height of the upper face of the second holding portion 11 low, the height of the wire 8 can be reduced. This mitigates the limitations on the thickness of the semiconductor device and enables size reduction, as well as allows for reduction of weight and cost.

Embodiment 2

Figure 3:
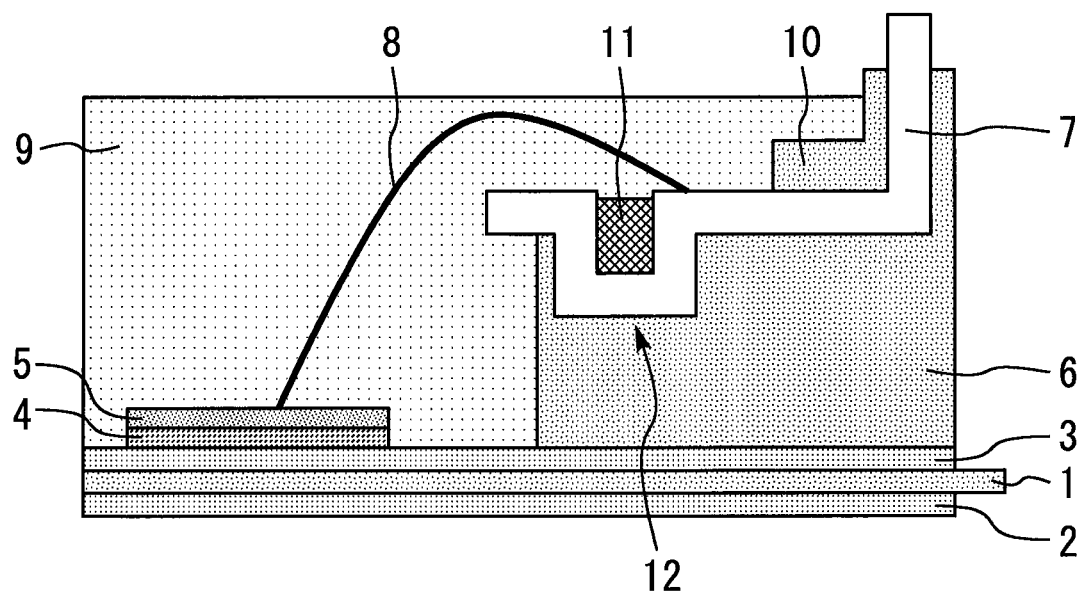
FIG. 3 is a cross-sectional view illustrating a semiconductor device according to Embodiment 2 of the present invention.

FIG. 3 is a cross-sectional view illustrating a semiconductor device according to Embodiment 2 of the present invention. The recess 12 is spaced outward from the inner end face of the case 6. This way, a certain length of creeping distance can be secured between the semiconductor chip 5 and the case electrode 7. Other structures and effects are the same as those of Embodiment 1.

Embodiment 3

Figure 4:
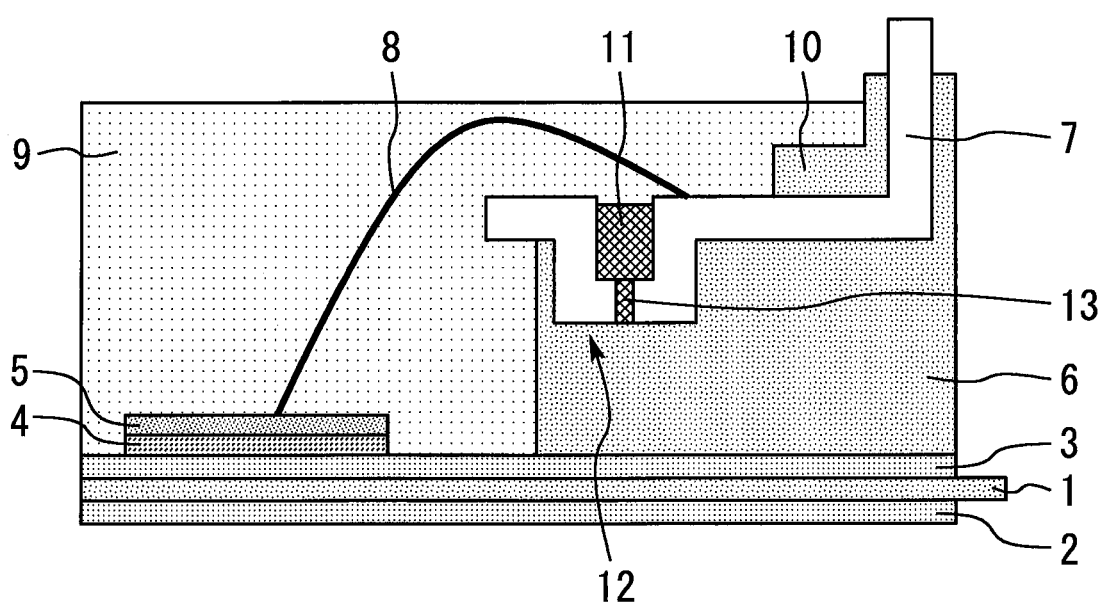
FIG. 4 is a cross-sectional view illustrating a semiconductor device according to Embodiment 3 of the present invention.

FIG. 4 is a cross-sectional view illustrating a semiconductor device according to Embodiment 3 of the present invention. A through hole 13 is formed in a bent portion of the case electrode 7. This allows the case resin to flow to the second holding portion 11 through the through hole 13 when forming the second holding portion 11 with the case resin. Other structures and effects are the same as those of Embodiment 2. While the through hole 13 is added to the configuration of Embodiment 2 here, the through hole 13 may be added to the configuration of Embodiment 1.

Embodiment 4

Figure 5:
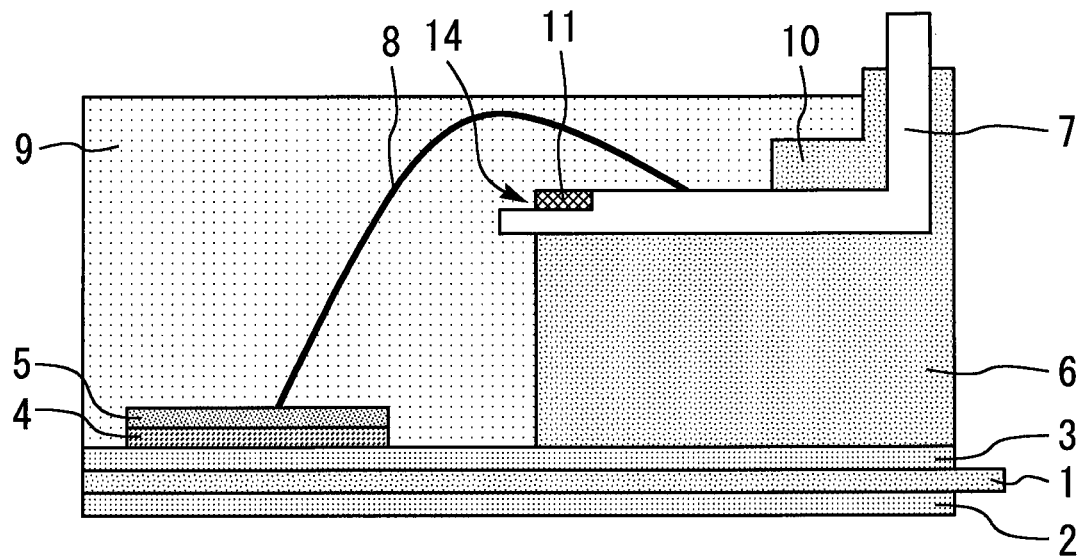
FIG. 5 is a cross-sectional view illustrating a semiconductor device according to Embodiment 4 of the present invention.

FIG. 5 is a cross-sectional view illustrating a semiconductor device according to Embodiment 4 of the present invention. In this embodiment, the case electrode 7 is ground to form a recess 14 in the upper face of the case electrode 7. The second holding portion 11 is disposed inside the recess 14. This way, the same effects as those of Embodiment 1 can be achieved. Further, as compared to the bending process in Embodiment 1, the processing accuracy of the case electrode 7 can be made higher.

Embodiment 5

Figure 6:
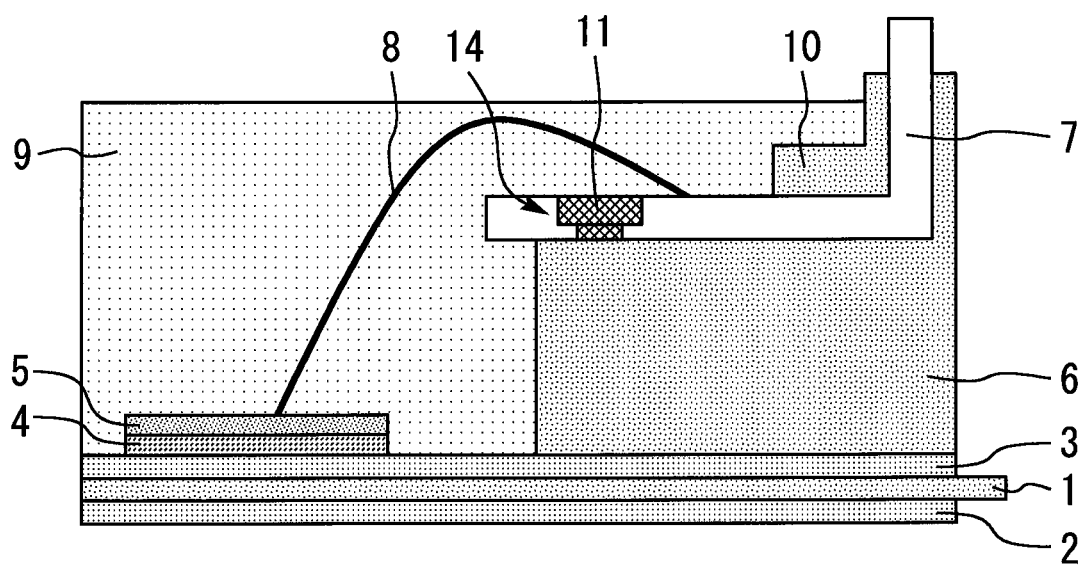
FIG. 6 is a cross-sectional view illustrating a semiconductor device according to Embodiment 5 of the present invention.
Figure 7:
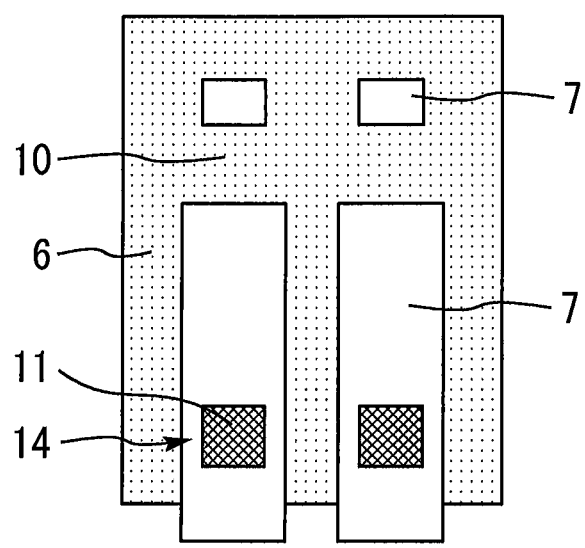
FIG. 7 is a top view illustrating a case electrode according to Embodiment 5 of the present invention.

FIG. 6 is a cross-sectional view illustrating a semiconductor device according to Embodiment 5 of the present invention. FIG. 7 is a top view illustrating a case electrode according to Embodiment 5 of the present invention. The recess 14 is a through hole that is reduced stepwise in width downward. The second holding portion 11 need only be placed inside the recess 14 of each case electrode 7, and need not be provided between adjacent case electrodes 7. Thus the amount of resin used for the second holding portion 11 can be reduced. Other structures and effects are the same as those of Embodiment 2.

Embodiment 6

Figure 8:
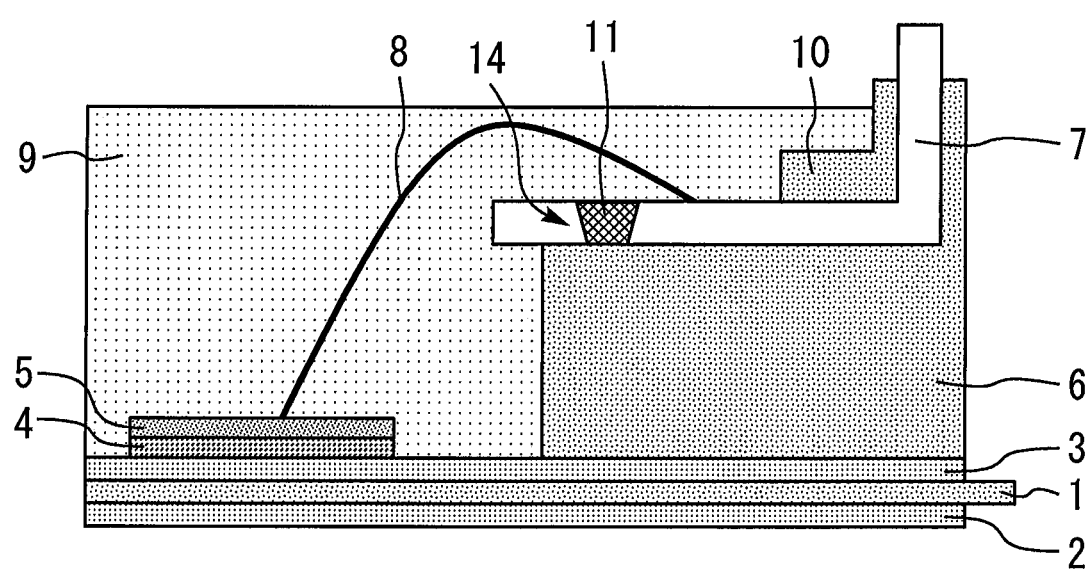
FIG. 8 is a cross-sectional view illustrating a semiconductor device according to Embodiment 6 of the present invention.
Figure 9:
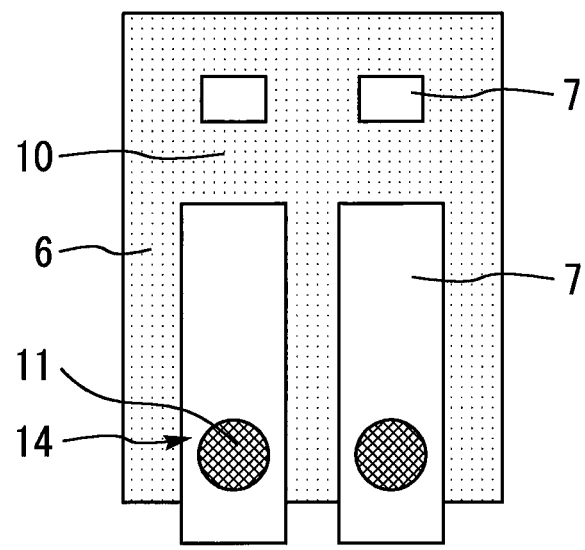
FIG. 9 is a top view illustrating a case electrode according to Embodiment 6 of the present invention.

FIG. 8 is a cross-sectional view illustrating a semiconductor device according to Embodiment 6 of the present invention. FIG. 9 is a top view illustrating a case electrode according to Embodiment 6 of the present invention. The recess 14 is a through hole having a trapezoidal cross-sectional shape. Thus the processing is easy. Other structures and effects are the same as those of Embodiment 5.

Embodiment 7

Figure 10:
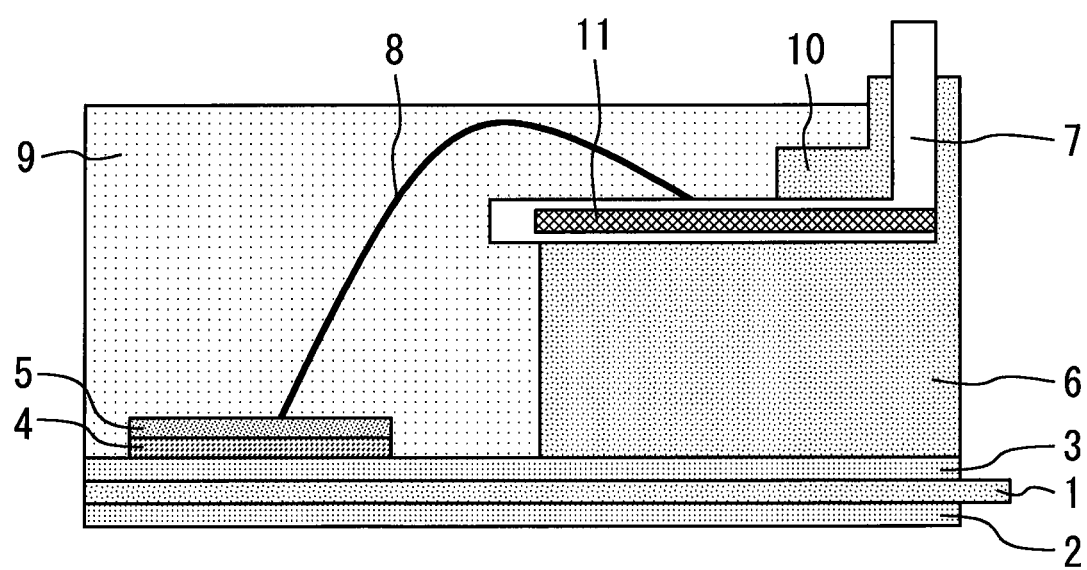
FIG. 10 is a cross-sectional view illustrating a semiconductor device according to Embodiment 7 of the present invention.
Figure 11:
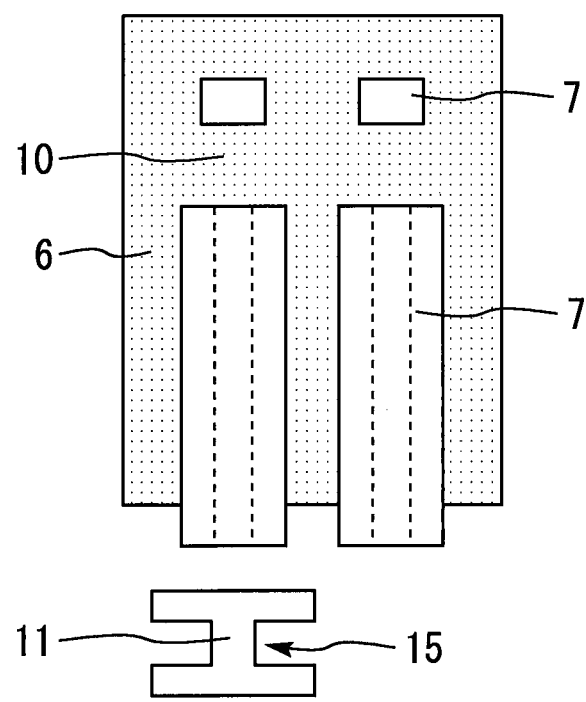
FIG. 11 is a top view and a cross-sectional view illustrating a case electrode according to Embodiment 7 of the present invention.

FIG. 10 is a cross-sectional view illustrating a semiconductor device according to Embodiment 7 of the present invention. FIG. 11 is a top view and a cross-sectional view illustrating a case electrode according to Embodiment 7 of the present invention. The case electrode 7 has an H-shape cross section, with recesses 15 in the side faces. With the case resin filled in the recesses 15, the case electrode 7 is fixed to the case 6. As the case electrode 7 is firmly fixed to the case 6 this way, the wire bonding properties can be improved. Also, since the second holding portion 11 need not be provided on the case electrode 7, the height of the wire 8 can be reduced.

Embodiment 8

Figure 12:
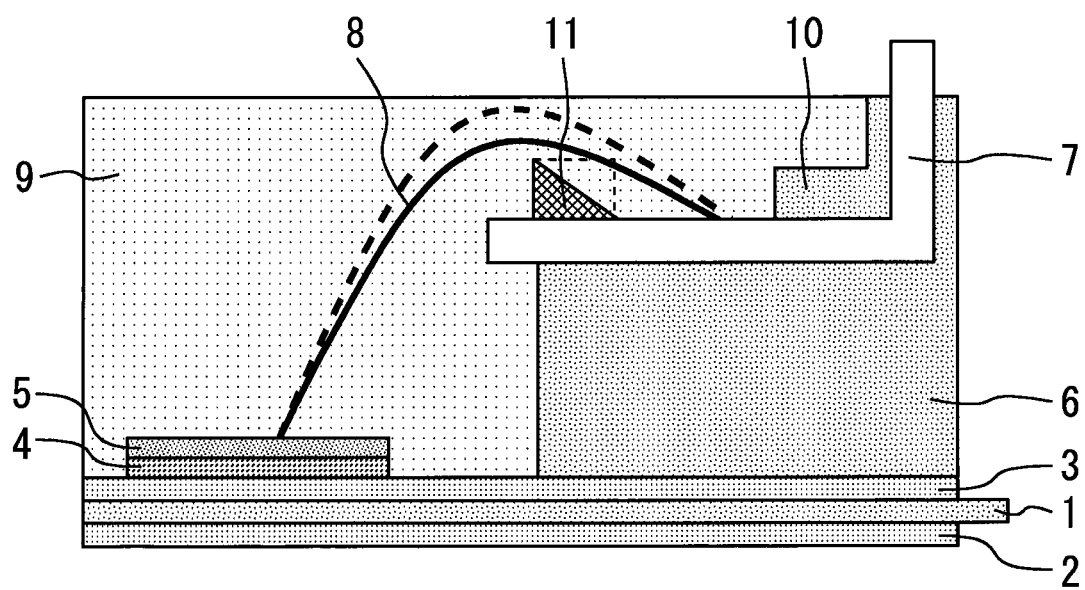
FIG. 12 is a cross-sectional view illustrating a semiconductor device according to Embodiment 8 of the present invention.
Figure 13:
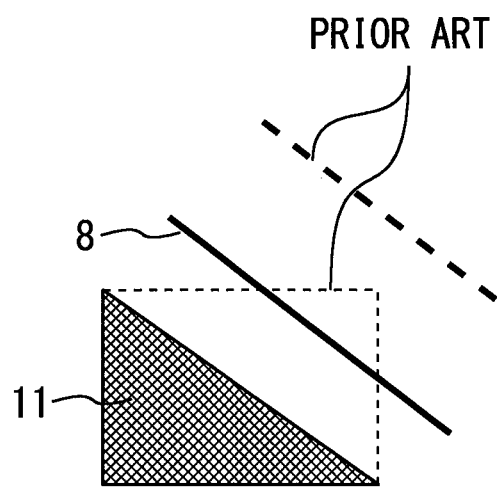
FIG. 13 is a cross-sectional view illustrating a second holding portion according to Embodiment 8 of the present invention to a larger scale.

FIG. 12 is a cross-sectional view illustrating a semiconductor device according to Embodiment 8 of the present invention. FIG. 13 is a cross-sectional view illustrating a second holding portion according to Embodiment 8 of the present invention to a larger scale. As with Embodiment 1, the first holding portion 10 and the second holding portion 11 press down both ends of the case electrode 7 to firmly secure the case electrode 7 to the case 6, so that the wire bonding properties can be improved.

In this embodiment, the second holding portion 11 is tapered along the wire 8. The second holding portion 11 is ground in a tapered shape such as to avoid the wire 8, whereby a certain distance is secured between the second holding portion 11 and the wire 8. This allows the height of the wire 8 to be reduced without changing the structure of the case electrode 7.

Embodiment 9

Figure 14:
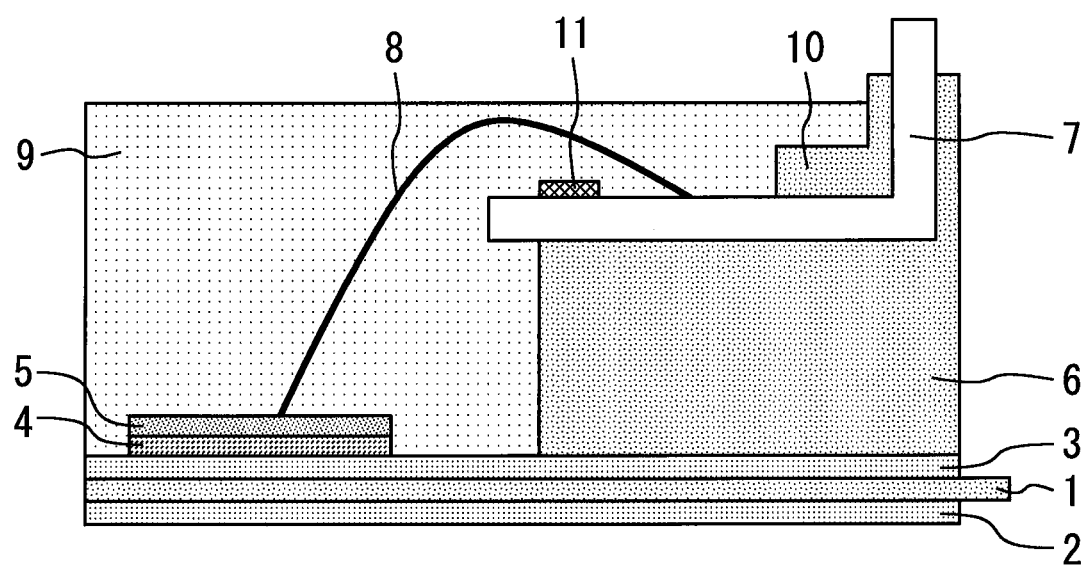
FIG. 14 is a cross-sectional view illustrating a semiconductor device according to Embodiment 9 of the present invention.
Figure 15:
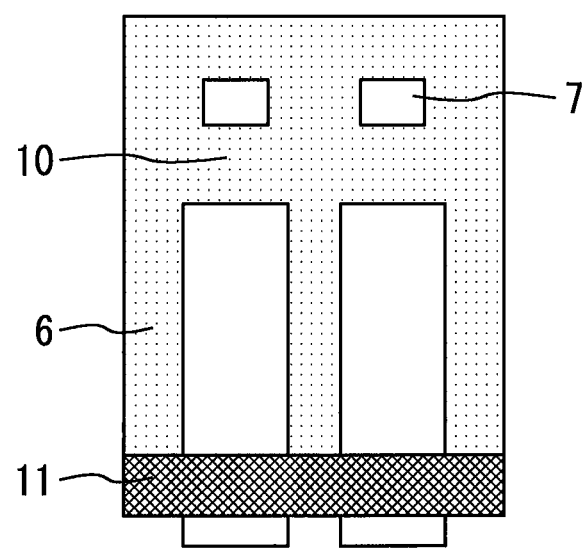
FIG. 15 is a top view illustrating a case electrode according to Embodiment 9 of the present invention.

FIG. 14 is a cross-sectional view illustrating a semiconductor device according to Embodiment 9 of the present invention. FIG. 15 is a top view illustrating a case electrode according to Embodiment 9 of the present invention. As with Embodiment 1, the first holding portion 10 and the second holding portion 11 press down both ends of the case electrode 7 to firmly secure the case electrode 7 to the case 6, so that the wire bonding properties can be improved.

The second holding portion 11, if formed from the same resin material as that of the case 6 such as to extend around over the electrodes, will end up having a large height. In this embodiment, therefore, the second holding portion 11 is formed by application of adhesive. This allows the height of the second holding portion 11 to be reduced without changing the structure of the case electrode 7.

The semiconductor chip 5 is a MOSFET, SBD, IGBT, PN diode or the like. The semiconductor chip 5 is not limited to a semiconductor chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip 5 formed of such a wide-bandgap semiconductor has a high voltage resistance and a high allowable current density, and thus can be miniaturized. The use of such a miniaturized semiconductor chip 5 enables the miniaturization and high integration of the semiconductor device in which the semiconductor chip 5 is incorporated. Further, since the semiconductor chip 5 has a high heat resistance, a radiation fin of a heatsink can be miniaturized and a water-cooled part can be air-cooled, which leads to further miniaturization of the semiconductor device. Further, since the semiconductor chip 5 has a low power loss and a high efficiency, a highly efficient semiconductor device can be achieved.

REFERENCE SIGNS LIST 5 semiconductor chip; 6 case; 7 case electrode; 8 wire; 10 first holding portion; 11 second holding portion; 12,14,15 recess; 13 through hole

The invention claimed is:

1. A semiconductor device comprising:
a semiconductor chip;
a case surrounding the semiconductor chip;
a case electrode attached to an upper face of the case;
a wire connected to the semiconductor chip and the case electrode;
a first holding portion pressing down the case electrode on the upper face of the case outside a joint portion where the wire is bonded to the case electrode; and
a second holding portion pressing down the case electrode on the upper face of the case inside the joint portion,
wherein a recess is formed on the upper face of the case, the case electrode is bent such as to fit into the recess, and the second holding portion is disposed inside the recess.

2. The semiconductor device according to claim 1, wherein the recess is spaced from an inner end face of the case.

3. The semiconductor device according to claim 1, wherein a through hole is formed in a bent portion of the case electrode.

4. The semiconductor device according to claim 1, wherein an upper face of the second holding portion is positioned at a height not greater than a height of an upper face of the joint portion of the case electrode.

5. The semiconductor device according to claim 1, wherein the semiconductor chip is made of a wide-band-gap semiconductor having a bandgap wider than that of silicon.

6. A semiconductor device comprising:
a semiconductor chip;
a case surrounding the semiconductor chip;
a case electrode attached to an upper face of the case;
a wire connected to the semiconductor chip and the case electrode;
a first holding portion pressing down the case electrode on the upper face of the case outside a joint portion where the wire is bonded to the case electrode; and
a second holding portion pressing down the case electrode on the upper face of the case inside the joint portion,
wherein a recess is formed on the upper face of the case, and
the second holding portion is disposed inside the recess.

7. The semiconductor device according to claim 6, wherein the recess is a through hole that is reduced in width downward.

8. The semiconductor device according to claim 7, wherein the recess is a through hole having a trapezoidal cross-sectional shape.

9. The semiconductor device according to claim 6, wherein an upper face of the second holding portion is positioned at a height not greater than a height of an upper face of the joint portion of the case electrode.

10. The semiconductor device according to claim 6, wherein the semiconductor chip is made of a wide-band-gap semiconductor having a bandgap wider than that of silicon.

11. A semiconductor device comprising:
a semiconductor chip;
a case surrounding the semiconductor chip;
a case electrode attached to an upper face of the case; and
a wire connected to the semiconductor chip and the case electrode,
wherein a recess is formed on a side face of the case electrode, and
the case electrode is fixed to the case with case resin filled in the recess.

12. The semiconductor device according to claim 11, wherein the semiconductor chip is made of a wide-band-gap semiconductor having a bandgap wider than that of silicon.

13. A semiconductor device comprising:
a semiconductor chip;
a case surrounding the semiconductor chip;
a case electrode attached to an upper face of the case;
a wire connected to the semiconductor chip and the case electrode;
a first holding portion pressing down the case electrode on the upper face of the case outside a joint portion where the wire is bonded to the case electrode; and
a second holding portion pressing down the case electrode on the upper face of the case inside the joint portion,
wherein the second holding portion is tapered along the wire.

14. The semiconductor device according to claim 13, wherein the semiconductor chip is made of a wide-band-gap semiconductor having a bandgap wider than that of silicon.

15. A semiconductor device comprising:
a semiconductor chip;
a case surrounding the semiconductor chip;
a case electrode attached to an upper face of the case;
a wire connected to the semiconductor chip and the case electrode;
a first holding portion pressing down the case electrode on the upper face of the case outside a joint portion where the wire is bonded to the case electrode; and
a second holding portion pressing down the case electrode on the upper face of the case inside the joint portion,
wherein the second holding portion is adhesive.

16. The semiconductor device according to claim 15, wherein the semiconductor chip is made of a wide-band-gap semiconductor having a bandgap wider than that of silicon.

* * * * *